(12) United States Patent
Kalusalingam et al.

(10) Patent No.: US 9,019,029 B2
(45) Date of Patent: Apr. 28, 2015

(54) SYSTEMS AND METHODS FOR IMPEDANCE SWITCHING

(71) Applicant: Broadcom Corporation, Irvine, CA (US)

(72) Inventors: Shriram Kalusalingam, Irvine, CA (US); Massimo Brandolini, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 75 days.

(21) Appl. No.: 13/831,312

(22) Filed: Mar. 14, 2013

(65) Prior Publication Data

US 2014/0197900 A1    Jul. 17, 2014

Related U.S. Application Data

(60) Provisional application No. 61/753,409, filed on Jan. 16, 2013.

(51) Int. Cl.
| | |
|---|---|
| *H03B 5/12* | (2006.01) |
| *H03L 7/16* | (2006.01) |
| *H03F 1/00* | (2006.01) |
| *H03H 7/01* | (2006.01) |

(52) U.S. Cl.
CPC ............. *H03L 7/16* (2013.01); *H03B 5/1228* (2013.01); *H03B 5/1215* (2013.01); *H03F 1/00* (2013.01); *H03B 5/1265* (2013.01); *H03H 7/0153* (2013.01)

(58) Field of Classification Search
USPC .......................................... 331/117 R, 177 V
See application file for complete search history.

(56) References Cited

U.S. PATENT DOCUMENTS

| | | | | |
|---|---|---|---|---|
| 6,388,536 | B1* | 5/2002 | Welland | 331/177 R |
| 7,259,638 | B2* | 8/2007 | Takahashi | 331/179 |
| 7,336,134 | B1* | 2/2008 | Janesch et al. | 331/36 C |
| 8,044,739 | B2* | 10/2011 | Rangarajan et al. | 331/167 |
| 8,269,566 | B2* | 9/2012 | Upadhyaya et al. | 331/117 R |

OTHER PUBLICATIONS

Staszewski, et al., "A Digitally Controlled Oscillator in a 90nm Digital CMOS Process for Mobile Phones", IEEE Journal of Solid-State Circuits, Nov. 2005, pp. 2203-2211, vol. 40, No. 11.
Chen, et al, "A 12-Bit 3GS/s Pipeline ADC with 0.4mm2 and 500mW in 40nm Digital CMOS", IEEE JSSC, Apr. 2012, pp. 1013-1021, vol. 47, N. 4.
Andreani, et al., "A TX VCO for WCDMA/EDGE in 90nm RF CMOS", IEEE JSSC, Jul. 2011, pp. 1618-1626, vol. 46, N. 7.
Sai, et al., "A 570fsrms Integrated-Jitter Ring-VCO-Based 1.21GHz PLL with Hybrid Loop", IEEE ISSCC, Feb. 2011, pp. 98-100.
Fischette, "A 45nm SOI-CMOS Dual-PLL Processor Clock System for Multi-Protocol I/O", IEEE ISSCC, Feb. 2010, pp. 246-248.
Rao, et al., "A 0.46ps RJrms 5GHz Wideband LC PLL for Multi-Protocol 10Gb/s SerDes", IEEE CICC, Sep. 2009, pp. 239-242.

* cited by examiner

*Primary Examiner* — Joseph Chang
(74) *Attorney, Agent, or Firm* — McDermott Will & Emery LLP

(57) ABSTRACT

Systems and methods for switching impedance are provided. In some aspects, a system includes first and second impedance elements and an impedance switch module, which includes a third impedance element coupled between the first and second impedance elements and a switch parallel to the third impedance element. The switch is coupled between the first and second impedance elements, and is configured to switch between an open configuration and a closed configuration. An electrical path is completed between the first impedance element and the second impedance element via the first switch in the closed configuration. The electrical path is not completed in the open configuration. A total impedance of the first impedance element, the second impedance element, and the impedance switch module is varied based on the switching between the open configuration and the closed configuration.

20 Claims, 4 Drawing Sheets

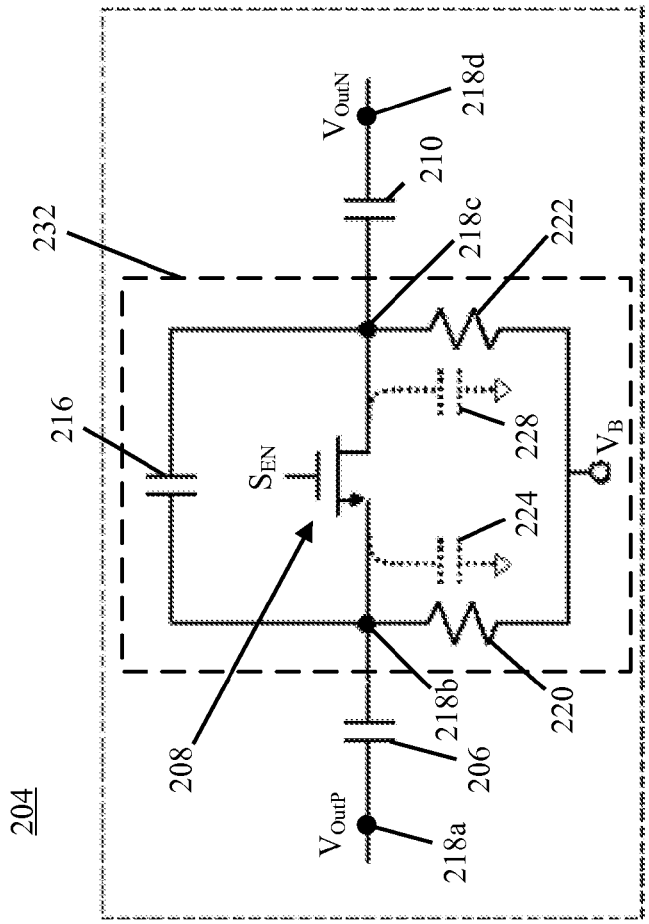
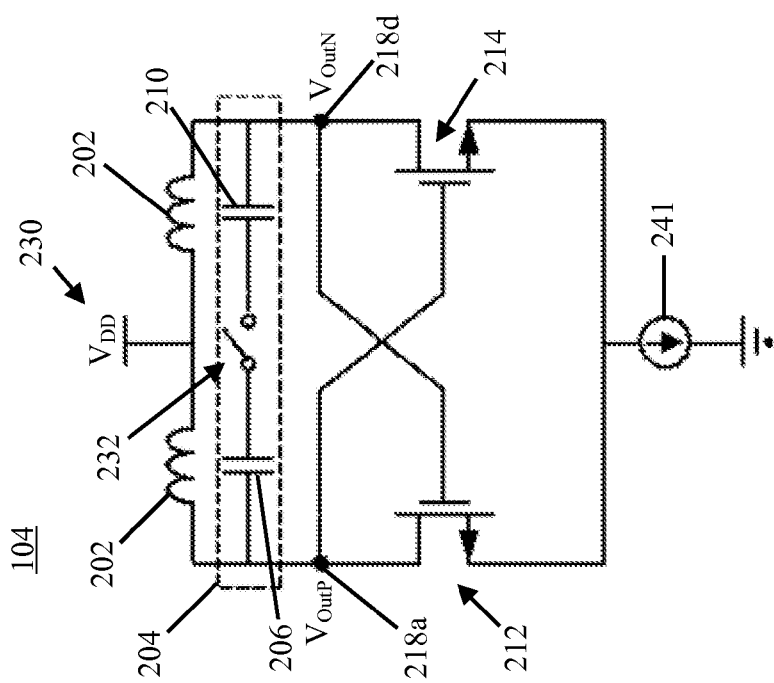
FIG. 2B
FIG. 2A

SYSTEMS AND METHODS FOR IMPEDANCE SWITCHING

CROSS-REFERENCES TO RELATED APPLICATIONS

The present application claims the benefit of U.S. Provisional Patent Application Ser. No. 61/753,409, titled "Digitally Controlled Partitioned Capacitor in LC Oscillator," filed on Jan. 16, 2013, which is hereby incorporated by reference in its entirety for all purposes.

FIELD

The subject technology generally relates to electrical circuits and, in particular, relates to systems and methods for switching impedances for electrical circuits.

BACKGROUND

The electrical impedance of a circuit element is the measure of the element's opposition to the passage of a current when a voltage is applied. In quantitative terms, the electrical impedance is the complex ratio of the voltage to the current in an alternating current (AC) circuit. Impedance extends the concept of resistance to AC circuits, and possesses both magnitude and phase (unlike resistance, which only has magnitude). When a circuit is driven with direct current (DC), there is no distinction between impedance and resistance; the latter can be thought of as impedance with zero phase angle. The concept of impedance is introduced in AC circuits because there are other mechanisms impeding the flow of current besides the normal resistance of DC circuits, such as inductance and capacitance. Various electrical circuits may be formed from one or more elements providing impedance, such as resistors, capacitors, and inductors. Depending on the impedance that is introduced to a particular circuit, a different result and/or function can be achieved.

BRIEF DESCRIPTION OF THE DRAWINGS

The accompanying drawings, which are included to provide further understanding of the subject technology and are incorporated in and constitute a part of this specification, illustrate aspects of the subject technology and together with the description serve to explain the principles of the subject technology.

FIG. 2A is a schematic diagram of an oscillator, in accordance with various aspects of the subject technology.

FIG. 2B is a schematic diagram of a unit capacitor implemented according to a partitioned capacitor scheme, in accordance with various aspects of the subject technology.

DETAILED DESCRIPTION

Figure 1:
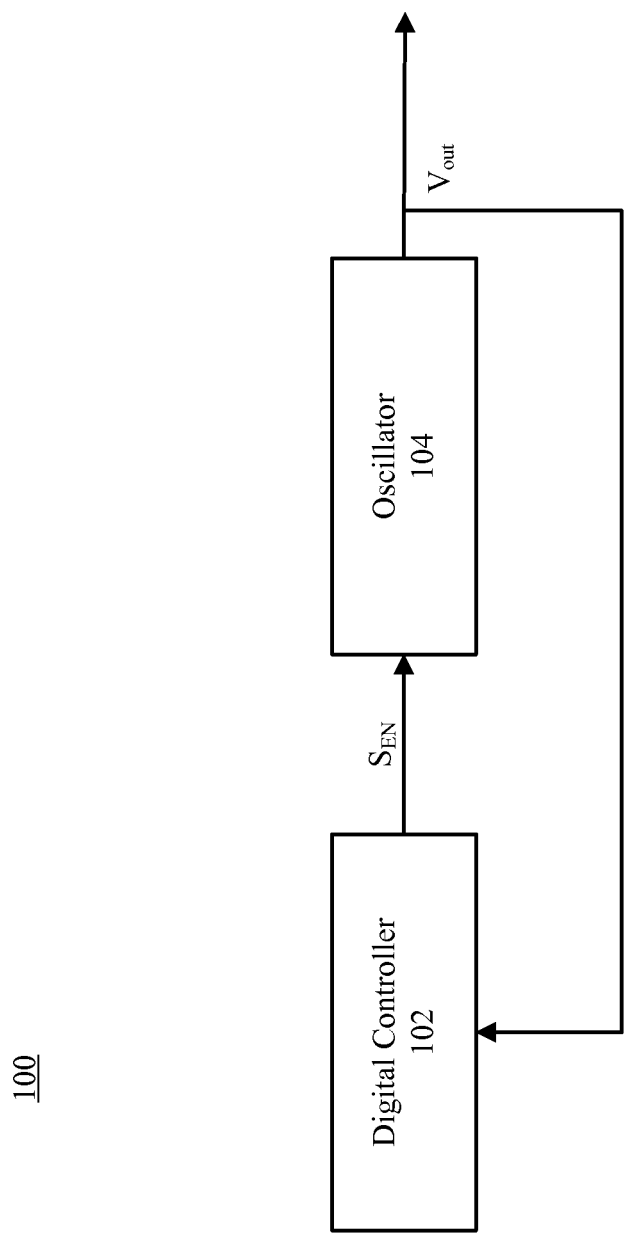
FIG. 1 is a block diagram of a digital phase locked loop, in accordance with various aspects of the subject technology.

In the following detailed description, numerous specific details are set forth to provide a full understanding of the subject technology. It will be apparent, however, that the subject technology may be practiced without some of these specific details. In other instances, structures and techniques have not been shown in detail so as not to obscure the subject technology.

According to various aspects of the subject technology, systems and methods are provided for switching impedances in various electrical circuits. In one or more implementations, the electrical circuits may include phase locked loops (PLLs), oscillators, amplifiers, filters, and/or other circuits that can benefit from the switching of impedances. According to certain aspects, impedance switching can play a role in minimizing the phase noise (PN) of digital PLLs (DPLLs).

The ever increasing data rate requirement in modern broadband communication systems such as cable, satellite, and multimedia over coax alliance (MoCA) has recently driven the development of high-speed analog-to-digital (A/D) and digital-to-analog (D/A) converters capable of direct-sampling the full radio frequency (RF) spectrum. To further increase capacity, multiple channels may be dedicated to a user's communication device, and higher orders of modulation, such as 1024 quadrature amplitude modulation (QAM) and 4096 QAM, are being introduced, which may require higher signal-to-noise ratio (SNR). As a result, higher resolution from converters and far more stringent PN and spurs requirements from PLLs may be needed. For example, in cable modem termination systems (CMTS), the multi-channel, broadband environment may require a sampling clock to achieve less than −83 dBc integrated PN in each 6 megahertz (MHz) band beyond 15 MHz from the carrier (referred at 1 gigahertz (GHz), including spurs), and a total integrated jitter as low as 200 $fs_{rms}$. Providing a PLL that meets such requirements may be difficult.

From an area and power consumption standpoint, DPLLs may be preferred to their analog counterparts. However, the oscillators (e.g., LC oscillators) in conventional DPLLS may typically be phase locked by dithering unit capacitors in the tank circuits of the oscillators. According to certain aspects, dithering the unit capacitors may involve the switching of capacitance of the unit capacitors in the tank circuits. Dithering the unit capacitors in the tank circuits may generate additional, unfiltered PN and spurs, which may land on other desired channels and corrupt their achievable SNR.

The PN of a DPLL can be reduced by increasing the dithering frequency. However, since thick-oxide transistor devices (also referred to as input/output (I/O) devices) are conventionally used as switches for unit capacitors, digital dithering the unit capacitors may be limited to low frequencies (e.g., at less than a GHz range), thereby resulting in higher PN. Furthermore, if thick-oxide transistor devices are used as switches, the switches may possess higher series ON resistance and may degrade the quality factor of a tank circuit, thereby degrading PN. In addition, although achieving fine and accurate frequency steps in the oscillator of a DPLL may be desirable, conventional designs may expose more parasitic capacitance into the tank circuit during an OFF state, which may limit the accuracy of the frequency steps.

According to various aspects of the subject technology, systems and methods are provided for achieving low PN in DPLLs, thereby allowing power to be saved for a given performance target. By achieving low PN, the design of new products that target high performance applications may be enabled. Furthermore, power for DPLLs used in existing applications may be reduced. According to certain aspects, low PN in DPLLs can be achieved by providing a capacitance switching scheme that partitions capacitance such that thin-oxide transistor devices (also referred to as core devices) may be used as switches rather than thick-oxide transistor devices. Using such a partitioned capacitor scheme, high speed dithering (e.g., at least in the GHz range) may be enabled in low PN, high-amplitude oscillators (e.g., having voltage swings greater than 1 volt).

According to certain aspects, thin-oxide transistor devices have minimum channel lengths that are less than the minimum channel lengths of thick-oxide devices (e.g., at least two times less). In one or more implementations, a thin-oxide transistor device may have a minimum channel length that is less than or equal to 28 nanometers (nm), while a minimum channel length of a thick-oxide transistor device may be at least 180 nm. However, according to certain aspects, it is understood that the thin-oxide transistor device and the thick-oxide transistor device can have any minimum channel length, but the distinction between the thin-oxide transistor device and the thick-oxide transistor device is how much shorter the minimum channel length of the thin-oxide transistor device is to the minimum channel length of the thick-oxide transistor device. Furthermore, thin-oxide transistor devices may have maximum operating voltages that are less than the maximum operating voltages of thick-oxide transistor devices (e.g., at least 1.8 times less). In one or more implementations, a thin-oxide transistor device may have a maximum operating voltage of less than or equal to 1 volt, while a thick-oxide transistor device may have a maximum operating voltage of less than or equal to 1.8 volts. However, according to certain aspects, it is understood that the thin-oxide transistor device and the thick-oxide transistor device can have any maximum operating voltages, but the distinction between the thin-oxide transistor device and the thick-oxide transistor device is how much lower the maximum operating voltage of the thin-oxide transistor device is to the maximum operating voltage of the thick-oxide transistor device.

In general, higher amplitude voltage swings in an oscillator may reduce the PN of a DPLL. Because thick-oxide transistor devices have greater maximum operating voltages than thin-oxide transistor devices and therefore can support higher amplitude voltage swings, thick-oxide transistor devices are typically used as switches in the unit capacitors of a tank circuit of the oscillator. However, the use of thin-oxide transistor devices allows higher quality factor and lower PN to be achieved. High speed dithering can be applied to thin-oxide switches that turn partitioned capacitors ON/OFF, thereby minimizing PN due to the dithering itself. In some aspects, accurate frequency steps may be achieved by designing partitioned capacitors with well controlled ON and OFF capacitance. Aspects of the subject technology provide a partitioned capacitor scheme that allows thin-oxide transistor devices to be used as switches in an oscillator such that both high speed dithering and high amplitude voltage swings are enabled (despite the lower maximum operating voltages of the thin-oxide transistor devices compared to the maximum operating voltages of thick-oxide transistor devices).

FIG. 1 is a block diagram of DPLL 100, in accordance with various aspects of the subject technology. DPLL 100 includes digital controller 102 and oscillator 104 (e.g., a digitally controlled oscillator (DCO)) coupled to digital controller 102. According to certain aspects, oscillator 104 may be the only analog element in the loop provided by DPLL 100. All other components of DPLL 100 (digital controller 102 and the components therein) may be digital. In some aspects, digital controller 102 may generate a switching signal $S_{EN}$ (e.g., a digital signal) to control a desired impedance of a tank circuit of oscillator 104 such that the output voltage $V_{out}$ is produced at a desired frequency (e.g., the switching signal $S_{EN}$ may be used to control a switch used in one or more unit capacitors of the tank circuit to control the total capacitance of the tank circuit). Digital controller 102 may measure the frequency of the output voltage $V_{out}$ as feedback, and adjust the switching signal $S_{EN}$ as needed to achieve the desired frequency.

For example, in one or more implementations, a reference clock may be 50 MHz for DPLL 100. In some aspects, digital controller 102 may employ a bang-bang phase detector (e.g., a flip-flop) to compare reference and feedback phases (e.g., from output voltage $V_{out}$). The phase difference information may be filtered by a proportional-integral (PI) loop filter and may be used to control oscillator 104 (e.g., via the switching signal $S_{EN}$ generated by digital controller 102).

According to certain aspects, the switching signal $S_{EN}$ may be used as a dithering signal. In one or more implementations, digital controller 102 may increase a frequency of the switching signal $S_{EN}$ so that the PN of DPLL 100 can be decreased. For example, the frequency of the switching signal $S_{EN}$ may be increased to at least 1 GHz. According to certain aspects, oscillator 104 may employ a partitioned capacitor scheme that allows thin-oxide transistor devices to be used as switches such that both high speed dithering (e.g., of the switching signal $S_{EN}$) and high amplitude voltage swings are enabled. In one or more implementations, the partitioned capacitor scheme allows DPLL 100 to be designed as a 5 GHz DPLL that achieves 146 $fs_{rms}$ integrated jitter while burning only 24 milliwatts (mW). However, it is understood that DPLL 100 may be designed with other values that allow it to exceed state-of-art performances.

FIG. 2A is a schematic diagram of oscillator 104, in accordance with various aspects of the subject technology. Oscillator 104 includes power supply 230 (e.g., that generates supply voltage $V_{DD}$), a tank circuit coupled to power supply 230 and formed by one or more inductors 202 in parallel with unit capacitor 204, transistors 212 and 214 (e.g., thick-oxide transistor devices arranged in a cross-coupled pair configuration) coupled to the tank circuit, and current source 241 coupled to transistors 212 and 214. According to certain aspects, oscillator 104 is configured to generate an output voltage (e.g., positive output voltage $V_{OutP}$ at node 218a and/or negative output voltage $V_{OutN}$ at node 218d) at a target phase and/or a target frequency based on the switching signal $S_{EN}$ provided by digital controller 102.

In particular, the switching signal $S_{EN}$ may control a total impedance of the tank circuit such that the tank circuit generates a signal (e.g., positive output voltage $V_{OutP}$ at node 218a and/or negative output voltage $V_{OutN}$ at node 218d) at a target phase and/or a target frequency. As shown in FIG. 2A, the tank circuit includes one or more inductors 202 and unit capacitor 204. Although only one unit capacitor is shown in FIG. 2A, it is understood that the tank circuit can include any number of unit capacitors parallel to the one or more inductors 202 (e.g., a bank of unit capacitors). According to certain aspects, the tank circuit may include a switchable array of capacitors that, when switched by the control of the switching signal $S_{EN}$, may provide various capacitances for changing the frequency and/or phase of a signal. For example, as shown in FIG. 2A, unit capacitor 204 includes capacitors 206 and 210, with capacitance switch module 232 coupled therebetween. Capacitance switch module 232 includes a thin-oxide transistor device as a switch. The total capacitance of unit capacitor 204 may change depending on the particular configuration of capacitance switch module 232 (e.g., whether its switch is open or closed).

As discussed above, since high voltage swings in a low PN DPLL is desirable, thick-oxide transistor devices are typically used as the switches for the switchable array of capacitors. However, using thick-oxide transistor devices as the switches may significantly increase the parasitic capacitance on the nodes before and after the switches, which may be non-linear, and may limit the minimum achievable incremental capacitance ΔC (e.g., thereby limiting the minimization of dithering noise in the DPLL). Using a thick-oxide transistor device as a switch instead of capacitance switch module 232, for example, may degrade the quality factor of unit capacitor 204 when it is in the ON state, thereby affecting the PN performance of oscillator 104 at higher frequencies (where the quality factor of the one or more inductors 202 is not necessarily the only limiting factor). Usage of a thick-oxide transistor device as the switch may heavily limit the maximum speed at which unit capacitor 204 can be dithered because a level-shifter may be needed when interfacing digitally controlled oscillator 104 with digital controller 102 (which may comprise thin-oxide digital dithering circuitry). As a result, DPLL 100 may be prevented from keeping the dithering noise low. In one or more implementations, PN due to dithering may be given by:

$$PN_{SD}(f) = \frac{\Delta f_{DCO}^2}{12} \frac{1}{f_{DTH}} \frac{1}{f^2} \left(2\sin\frac{\pi f}{f_{DTH}}\right)^{2n} \quad (1)$$

where $\Delta f_{DCO}$ is the oscillator frequency step (e.g., defined by $\Delta C$), $f_{DTH}$ is the dithering frequency, and n is the order of $\Delta\Sigma$ modulator producing the dithering signal.

According to various aspects of the subject technology, PN may be reduced by implementing unit capacitor 204 according to a partitioned capacitor scheme. FIG. 2B is a schematic diagram of unit capacitor 204 implemented according to a partitioned capacitor scheme, in accordance with various aspects of the subject technology. The partitioned capacitor scheme provides good control of ON and OFF capacitors in the tank circuit to synthesize fine and accurate frequency steps, facilitates high speed dithering on unit capacitor 204, and eliminates a power hungry level-shifter interface that would be needed between digital controller 102 and oscillator 104 if a thick-oxide transistor device were used as a switch instead.

As shown in FIG. 2B, unit capacitor 204 includes capacitors 206 and 210. Capacitor 206 is coupled to node 218a at which the positive output voltage $V_{OutP}$ is received and/or generated. Capacitor 210 is coupled to node 218d at which the negative output voltage $V_{OutN}$ is received and/or generated. Capacitance switch module 232 is coupled between capacitors 206 and 210. In particular, capacitance switch module 232 includes capacitor 216 (e.g., coupled to capacitor 206 at node 218b and coupled to capacitor 210 at node 218c). Capacitance switch module 232 also includes switch 208 that is parallel to capacitor 216 (e.g., switch 208 is coupled to capacitor 206 at node 218b and coupled to capacitor 210 at node 218c). Switch 208 may switch between an open configuration and a closed configuration. In one or more implementations, switch 208 is a thin-oxide transistor device with its gate terminal receiving the switching signal $S_{EN}$, and its drain and source terminals coupled between capacitors 206 and 210. While an electrical path is completed between capacitors 206 and 210 via switch 208 in the closed configuration, the electrical path is not completed in the open configuration. Parasitic capacitance is represented at nodes 218b and 218c by capacitors 224 and 228, respectively. In some aspects, unit capacitor 204 also includes biasing resistors 220 and 222 coupled to nodes 218b and 218c, respectively.

According to various aspects of the subject technology, a total capacitance of unit capacitor 204 may be varied based on the switching between the open configuration and the closed configuration (e.g., as controlled by the switching signal $S_{EN}$). In some aspects, a magnitude of capacitors 206, 210, and/or 216 may be selected such that the output voltage $V_{OutP}$ at node 218a and/or $V_{OutN}$ at node 218d are attenuated to be less than or equal to a maximum operating voltage of switch 208 at nodes 218b and 218c. For example, in one or more implementations, a magnitude of capacitor 206 may be equal to a magnitude of capacitor 210 (e.g., assume a value of C1), and a magnitude of capacitor 216 may be greater than the magnitude of capacitors 206 and 210 (e.g., assume a value of C2, which is greater than C1).

According to certain aspects, the single-ended capacitance is C1 when switch 208 is in the closed configuration, and is the series of C1 and C2+$C_{dSW}$ (parasitic capacitance at the drain of switch 208) when switch 208 is in the open configuration. Compared to conventional designs, the implementation of the partitioned capacitor scheme has several advantages. First, with proper sizing of C1 and C2, the voltage swing at the terminals of switch 208 (e.g., at nodes 218b and 218c) may be less than the maximum operating voltage of switch 208, thereby enabling the use of a thin-oxide transistor device for switch 208. The partitioned capacitor scheme allows the thin-oxide transistor device (in parallel with capacitor 216) to receive at least the same amplitude of an output voltage as a thick-oxide transistor device would be able to receive if the thick-oxide transistor device were coupled between capacitors 206 and 210 instead of capacitance switch module 232. Consequently, the quality factor of the tank circuit may be significantly improved. Furthermore, the phase noise of DPLL 100 may not be degraded as it may be if the thick-oxide transistor device were coupled between capacitors 206 and 210 instead of capacitance switch module 232.

Furthermore, as discussed above, a level shifter is not needed between digital controller 102 and oscillator 104, thereby saving considerable power. Moreover, the parasitic capacitance of the thin-oxide transistor device of switch 208 may be a smaller fraction of C2, making this solution less sensitive over process, voltage, and temperature (PVT). Finally, the incremental tank capacitance $\Delta C$ is now C1/(1+ 2C2/C1), which is a fraction of C1, thereby allowing a significant reduction of both $\Delta f_{DCO}$ and PN.

Figure 3:
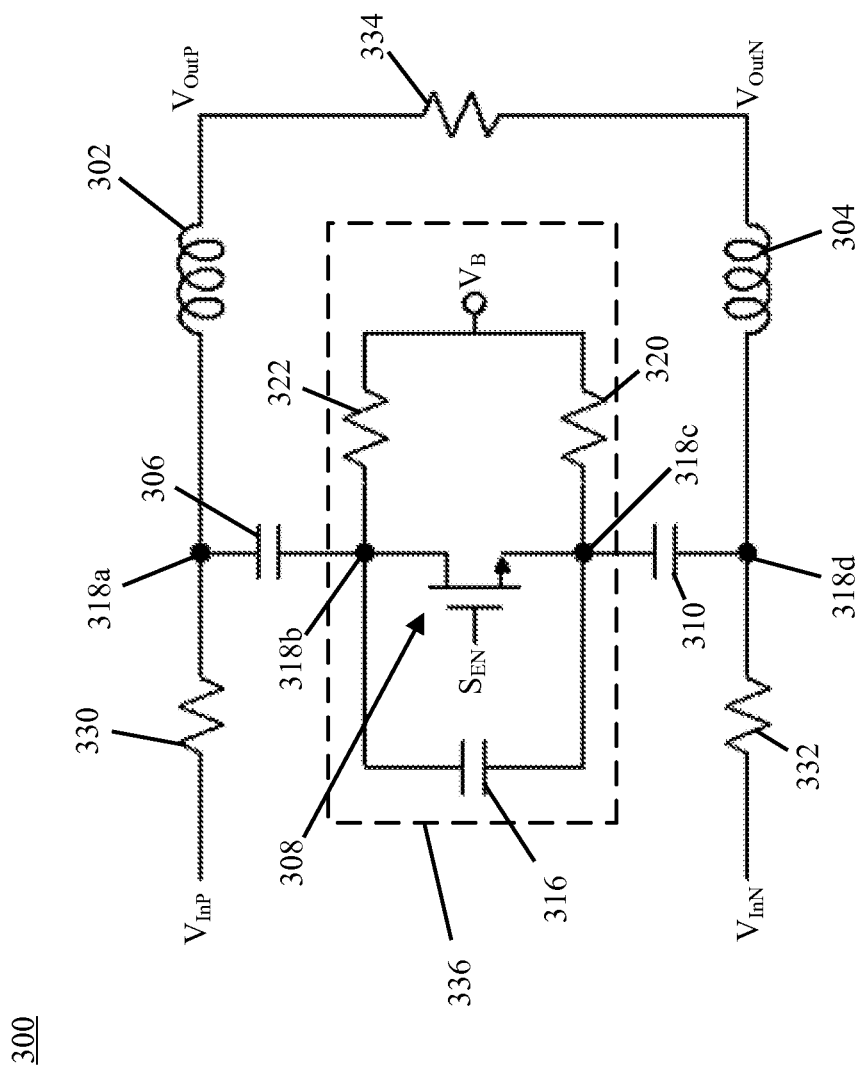
FIG. 3 is a schematic diagram of an LC low pass filter using a partitioned capacitor scheme, in accordance with various aspects of the subject technology.

Although the partitioned capacitor scheme is described as being implemented with oscillator 104, it is understood that the partitioned capacitor scheme may be used with other circuits where switching of impedances may be needed, such as in certain filter circuits. FIG. 3 is a schematic diagram of an LC low pass filter 300 using the partitioned capacitor scheme, in accordance with various aspects of the subject technology. As shown, LC low pass filter 300 includes inductors 302 and 304 in series with load resistor 334. Inductors 302 and 304, together with load resistor 334, are parallel to a unit capacitor that includes capacitors 306 and 310 with capacitance switch module 336 coupled therebetween. Capacitor 306 is coupled to inductor 302 at node 318a, while capacitor 310 is coupled to inductor 304 at node 318d. Similar to capacitance switch module 232, capacitance switch module 336 includes capacitor 316 (e.g., coupled to capacitor 306 at node 318b and coupled to capacitor 310 at node 318c). Capacitance switch module 336 also includes switch 308 (e.g., a thin-oxide transistor device coupled to capacitor 306 at node 318b and coupled to capacitor 310 at node 318c), which is parallel to capacitor 316. Capacitance switch module 336 includes biasing resistor 322 that is coupled to node 318b and biasing resistor 320 that is coupled to node 318c. A positive input voltage $V_{InP}$ is received at node 318a via input resistor 330, while a negative input voltage $V_{InN}$ is received at node 318d via input resistor 332.

According to certain aspects, capacitance switch module 336 may be controlled by a switching signal $S_{EN}$ to adjust a total capacitance of the unit capacitor. Depending on the value of the total capacitance, the unit capacitor may pass particular high frequency signals and resist particular low frequency signals (e.g., received from input resistors 330 and/or 332). In contrast, inductors 302 and 304 may pass the low frequency signals to load resistor 334 and resist the high frequency signals. According to certain aspects, use of a thin-oxide transistor device for the unit capacitor may ensure good linearity performance compared to using a thick-oxide transistor device.

Figure 4:
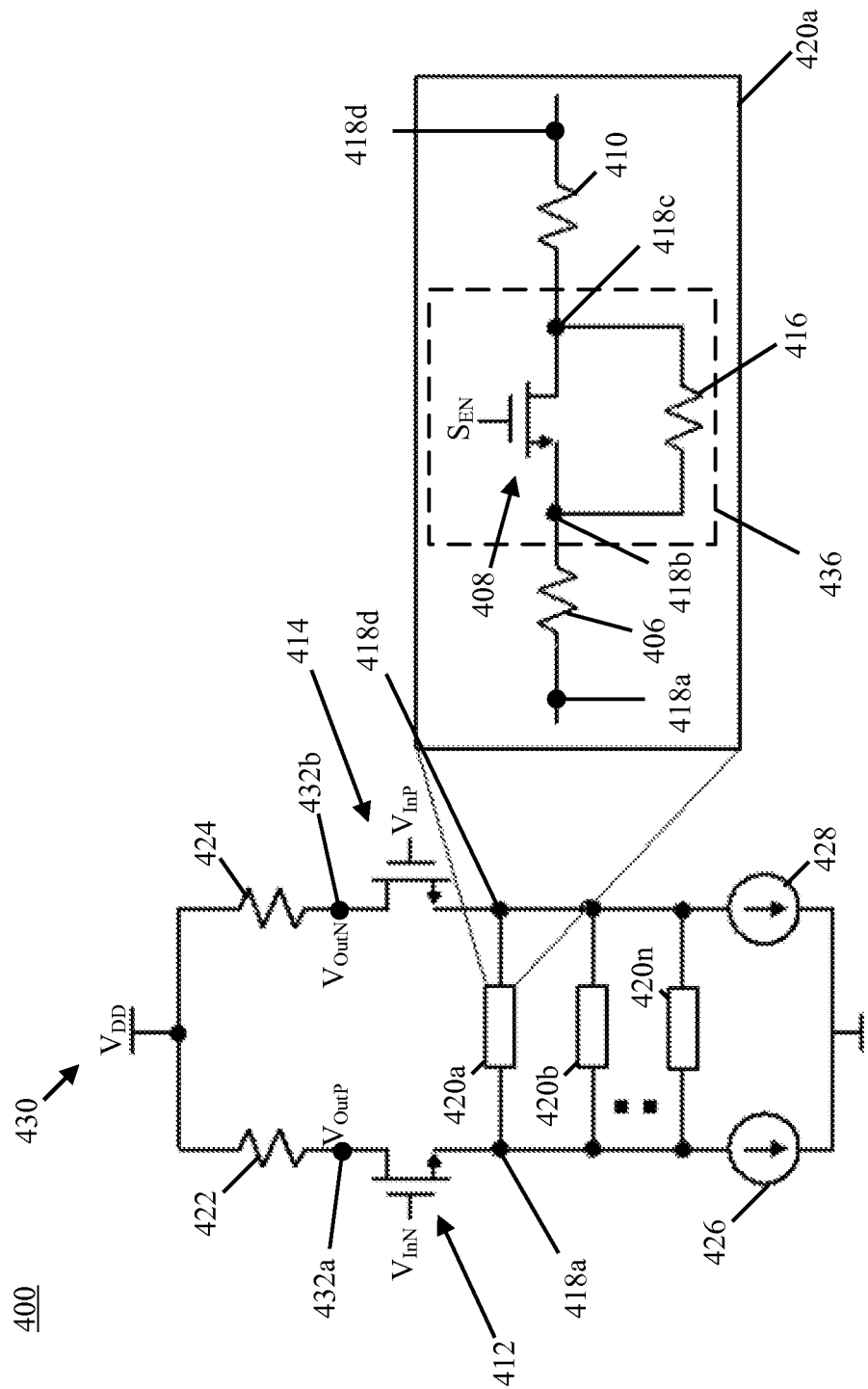
FIG. 4 is a schematic diagram of a source de-generated common source amplifier using a partitioned resistor scheme, in accordance with various aspects of the subject technology.

Although the partitioned capacitor scheme is described herein, it is understood that the subject technology encompasses the partitioning and/or switching of any impedance element, including resistors and inductors used for the same circuits described herein or for other circuits. FIG. 4 is a schematic diagram of a source de-generated common source amplifier 400 using a partitioned resistor scheme, in accordance with various aspects of the subject technology. Common source amplifier 400 includes power supply 430 (e.g., supplying voltage $V_{DD}$) and resistors 422 and 424 coupled to power supply 430. Common source amplifier 400 also includes transistor device 412 coupled to resistor 422 at node 432a and transistor device 414 coupled to resistor 424 at node 432b. Transistor device 412 receives negative input voltage $V_{InN}$ at its gate terminal and outputs positive output voltage $V_{OutP}$ at node 432a. Transistor device 414 receives positive input voltage $V_{InP}$ at its gate terminal and outputs negative output voltage $V_{OutN}$ at node 432b. Common source amplifier 400 further includes one or more unit resistor modules 420a to 420n, with each of these modules being coupled between transistor devices 412 and 414 (e.g., between nodes 418a and 418d). Common source amplifier 400 includes current source 426 coupled between node 418a and ground. Common source amplifier 400 also includes current source 428 coupled between node 418d and ground.

According to certain aspects, each of the one or more unit resistor modules 420a to 420n may be activated by a switch to vary an impedance between nodes 418a and 418d. In one or more implementations, unit resistor module 420a is shown as including resistor 406 coupled to node 418a and resistor 410 coupled to node 418d. Resistance switch module 436 is coupled between resistors 406 and 410. Resistance switch module 436 includes resistor 416, which is coupled to resistor 406 at node 418b and coupled to resistor 410 at node 418c. Resistance switch module 436 also includes switch 408, which may be a thin-oxide transistor device and is parallel to resistor 416. According to certain aspects, resistance switch module 436 may be controlled by a switching signal $S_{EN}$ (e.g., received at the gate terminal of switch 408) to adjust a total resistance of unit resistor module 420a. Use of thin-oxide transistor devices for the one or more unit resistor modules 420a to 420n may ensure good linearity performance compared to using thick-oxide transistor devices. Furthermore, gain range limitation (e.g., at high frequency) owing to higher parasitics from thick-oxide transistor devices can be relaxed.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items, and/or at least one of each of the items. By way of example, the phrases "at least one of A, B, and C" or "at least one of A, B, or C" each refer to only A, only B, or only C; any combination of A, B, and C; and/or at least one of each of A, B, and C.

The predicate words "configured to", "operable to", and "programmed to" do not imply any particular tangible or intangible modification of a subject, but, rather, are intended to be used interchangeably. In one or more implementations, a processor configured to analyze and control an operation or a component may also mean the processor being programmed to analyze and control the operation or the processor being operable to analyze and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "embodiment" does not imply that such embodiment is essential to the subject technology or that such embodiment applies to all configurations of the subject technology. A disclosure relating to an embodiment may apply to all embodiments, or one or more embodiments. An embodiment may provide one or more examples of the disclosure. A phrase such an "embodiment" may refer to one or more embodiments and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

The word "exemplary" is used herein to mean "serving as an example, instance, or illustration." Any embodiment described herein as "exemplary" or as an "example" is not necessarily to be construed as preferred or advantageous over other embodiments. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An impedance switching system, the system comprising:
   a first impedance element;
   a second impedance element; and
   an impedance switch module comprising:
      a third impedance element coupled between the first impedance element and the second impedance element, wherein the first impedance element, the second impedance element, and the third impedance element comprise similar types of circuit elements; and
      a first switch directly parallel to the third impedance element and coupled between the first impedance element and the second impedance element, the first switch being configured to switch between an open configuration and a closed configuration.

2. The system of claim 1, wherein each of the first impedance element, the second impedance element, and the third impedance element comprises at least one of a capacitor and a resistor.

3. The system of claim 1, wherein the first impedance element is coupled to a first node at which a first voltage swing is generated, wherein the third impedance element and the first switch are coupled to the first impedance element at a second node, wherein the third impedance element and the first switch are coupled to the second impedance element at a third node, and wherein the second impedance element is coupled to a fourth node at which a second voltage swing is generated.

4. The system of claim 3, wherein a magnitude of at least one of the first impedance element, the second impedance element, and the third impedance element is selected such that (i) the first voltage swing is attenuated at the second node to be less than or equal to a maximum operating voltage of the first switch and (ii) the second voltage swing is attenuated at the third node to be less than or equal to the maximum operating voltage of the first switch.

5. The system of claim 3, wherein a magnitude of the first impedance element is equal to a magnitude of the second impedance element, and wherein a magnitude of the third impedance element is greater than the magnitude of the first impedance element.

6. The system of claim 3, wherein the second voltage swing is at least equal to a third voltage swing that can be generated at the fourth node if a second switch, having a minimum channel length that is greater than a minimum channel length of the first switch, were coupled to the first impedance element at the first node and to the second impedance element at the third node instead of the third impedance element and the first switch.

7. The system of claim 3, wherein the second voltage swing is at least equal to a third voltage swing that can be generated at the fourth node if a second switch, having a maximum operating voltage that is greater than a maximum operating voltage of the first switch, were coupled to the first impedance element at the first node and to the second impedance element at the third node instead of the third impedance element and the first switch.

8. An oscillator comprising:
   the system of claim 3, wherein each of the first impedance element, the second impedance element, and the third impedance element comprises a capacitor; and
   an inductor unit parallel to the system and coupled to the system at the first node and the fourth node, the inductor unit comprising one or more inductors.

9. The oscillator of claim 8, further comprising a circuit coupled to the system and the inductor unit, the circuit being configured to generate the first voltage swing and to produce the second voltage swing at a target phase and a target frequency.

10. The oscillator of claim 9, wherein the first switch comprises a first transistor device, wherein the circuit comprises one or more second transistor devices, and wherein a minimum channel length of the first transistor device is less than a minimum channel length of each of the one or more second transistor devices.

11. The oscillator of claim 9, wherein the first switch comprises a first transistor device, wherein the circuit comprises one or more second transistor devices, and wherein a maximum operating voltage of the first transistor device is less than a maximum operating voltage of each of the one or more second transistor devices.

12. A digital phase locked loop (DPLL) comprising:
   a digital controller configured to generate a switching signal; and
   the oscillator of claim 8,
   wherein the first switch comprises a first transistor device having a first terminal coupled to the second node, a second terminal coupled to the third node, and a third terminal configured to receive the switching signal, and
   wherein the first switch is configured to switch between the open configuration and the closed configuration based on the switching signal.

13. The DPLL of claim 12, wherein the digital controller is configured to receive the first voltage swing or the second voltage swing from the fourth node and to generate the switching signal based on the first voltage swing or the second voltage swing.

14. The DPLL of claim 12, wherein the digital controller is configured to generate the switching signal such that the first voltage swing and the second voltage swing is produced at a target phase and a target frequency.

15. The DPLL of claim 12, wherein the digital controller is configured to increase a frequency of the switching signal, the increase in the frequency of the switching signal resulting in a decrease in phase noise of the DPLL.

16. A method for switching impedances, the method comprising:
providing a first impedance element and a second impedance element;
providing an impedance switch module comprising:
a third impedance element coupled between the first impedance element and the second impedance element, wherein the first impedance element, the second impedance element, and the third impedance element comprise similar types of circuit elements; and
a first switch directly parallel to the third impedance element and coupled between the first impedance element and the second impedance element;
switching the first switch between an open configuration and a closed configuration.

17. The method of claim 15, further comprising:
coupling the first impedance element to a first node at which a first voltage swing is generated, wherein the third impedance element and the first switch are coupled to the first impedance element at a second node, wherein the third impedance element and the first switch are coupled to the second impedance element at a third node;
coupling the second impedance element to a fourth node at which a second voltage swing is generated; and
varying at least one of a phase and a frequency of the first voltage swing and the second voltage swing based on the switching.

18. A capacitance partitioning system, the system comprising:
a first capacitor;
a second capacitor; and
a capacitance partitioning module comprising:
a third capacitor coupled between the first capacitor and the second capacitor; and
a first switch directly parallel to the third capacitor and coupled between the first capacitor and the second capacitor, the first switch being configured to switch between an open configuration and a closed configuration,
wherein an electrical path is completed between the first capacitor and the second capacitor via the first switch in the closed configuration.

19. The capacitance partitioning system of claim 18, wherein the first switch comprises a first transistor device having a maximum operating voltage of less than or equal to 1 volt.

20. The capacitance partitioning system of claim 18, wherein the first switch comprises a first transistor device having a minimum channel length of less than or equal to 28 nanometers.

* * * * *